United States Patent
Ohara et al.

(10) Patent No.: US 10,833,133 B2
(45) Date of Patent: Nov. 10, 2020

(54) DISPLAY DEVICE

(71) Applicant: Japan Display Inc., Minato-ku (JP)

(72) Inventors: Hiroki Ohara, Minato-ku (JP); Akinori Kamiya, Minato-ku (JP); Hiraaki Kokame, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/653,078

(22) Filed: Oct. 15, 2019

(65) Prior Publication Data

US 2020/0135812 A1 Apr. 30, 2020

(30) Foreign Application Priority Data

Oct. 30, 2018 (JP) ................................. 2018-203750

(51) Int. Cl.
*H01L 27/32* (2006.01)
*G06F 3/041* (2006.01)
*G06F 3/044* (2006.01)
*H01L 51/52* (2006.01)

(52) U.S. Cl.
CPC .......... *H01L 27/323* (2013.01); *G06F 3/0412* (2013.01); *G06F 3/0445* (2019.05); *H01L 27/3276* (2013.01); *H01L 51/5253* (2013.01); *G06F 3/0448* (2019.05)

(58) Field of Classification Search
CPC .............................. G06F 3/0445; G06F 3/0412
See application file for complete search history.

(56) References Cited

U.S. PATENT DOCUMENTS

| | | | |
|---|---|---|---|
| 6,458,711 B1* | 10/2002 | O'Brien | .................... C23F 1/02 257/E21.165 |
| 2003/0176037 A1* | 9/2003 | Inomata | ............ H01L 27/11502 438/253 |
| 2005/0040413 A1* | 2/2005 | Takahashi | ........... H01S 5/18308 257/96 |
| 2006/0227423 A1 | 10/2006 | Saiki et al. | |
| 2011/0124153 A1* | 5/2011 | Hosoba | ............. H01L 21/02554 438/104 |
| 2016/0254479 A1 | 9/2016 | Jeong et al. | |

FOREIGN PATENT DOCUMENTS

JP 2004-341503 A 12/2004

\* cited by examiner

*Primary Examiner* — Kevin M Nguyen
(74) *Attorney, Agent, or Firm* — Oblon, McClelland, Maier & Neustadt, L.L.P.

(57) ABSTRACT

A display device includes a sealing film covering a display region where an image is displayed, a touch sensor layer configured to detect a touched position of the display region, the touch sensor layer including a first electrode layer that is arranged on the sealing film, a first insulating layer that is formed on the first electrode layer using a material including nitrogen, and a second electrode layer that is arranged over the first insulating layer, an overcoat covering the touch sensor layer, and a polarizing plate being arranged on the overcoat. The touch sensor layer further includes a second insulating layer configured to inhibit a reaction between nitrogen included in the first insulating layer and water included in the overcoat, the second insulating layer being formed between the first insulating layer and the overcoat using a material not including nitrogen.

5 Claims, 9 Drawing Sheets

DISPLAY DEVICE

CROSS-REFERENCE TO RELATED APPLICATION

The present application claims priority from the Japanese Application JP2018-203750 filed on Oct. 30, 2018, the content of which is hereby incorporated by reference into this application.

BACKGROUND OF THE INVENTION

1. Field of the Invention

The present invention relates to a display device.

2. Description of the Related Art

A liquid crystal display device includes a polarizing plate in order to display an image. In addition, an organic EL display device includes a polarizing plate in order to improve visibility. Deterioration of the polarizing plate causes degradation of the quality of the display device. Therefore, for example, JP 2004-341503 A discloses a polarizing plate in which the durability of a polarizer included in the polarizing plate is improved.

In addition, a thin display device may deteriorate when impurity such as water penetrates into the thin display device. Therefore, a configuration in which a sealing film is arranged on a surface of a thin display device is known. For example, US2016/254479 A discloses a display device including a multilayer film having a surface on which six layers are laminated. In the multilayer film, a first inorganic insulating film, a first organic insulating film, a second inorganic insulating film, a second organic insulating film, a third inorganic insulating film, and a fourth inorganic insulating film are laminated in order from the lowermost layer. In addition, US2016/254479A discloses that an end portion of the fourth inorganic insulating film formed of AlO or the like is positioned on an end side of the display device further than an end portion of the third inorganic insulating film formed of SiN or the like.

SUMMARY OF THE INVENTION

The thin display device includes a layer formed of a material including nitrogen or a layer formed of a resin therein. Since water penetrates into the resin, water and the material including nitrogen cause a chemical reaction to occur, and $NH_3^+$ ions may be formed in the display device. The $NH_3^+$ ions damage an iodine complex included in a polarizing plate, which causes deterioration of the polarizing plate.

The present invention has been made in consideration of the above-described circumstances, and an object thereof is to provide a display device in which deterioration of a polarizing plate is prevented.

According to one aspect of the present invention, a display device includes a sealing film covering a display region where an image is configured to be displayed, a touch sensor layer configured to detect a touched position of the display region, the touch sensor layer including a first electrode layer that is arranged on the sealing film, a first insulating layer that is formed on the first electrode layer using a material including nitrogen, and a second electrode layer that is arranged over the first insulating layer, an overcoat covering the touch sensor layer, and a polarizing plate being arranged on the overcoat. The touch sensor layer further includes a second insulating layer configured to inhibit a reaction between nitrogen included in the first insulating layer and water included in the overcoat, the second insulating layer being formed between the first insulating layer and the overcoat using a material not including nitrogen.

In one embodiment of the present invention, the second insulating layer is arranged between the first insulating layer and the second electrode layer and covers the first insulating layer.

In one embodiment of the present invention, the second insulating layer is arranged between the second electrode layer and the overcoat and covers the display region.

In one embodiment of the present invention, the first insulating layer is formed of silicon nitride, and the second insulating layer is formed of silicon oxide or alumina.

In one embodiment of the present invention, the display device further includes a plurality of pixels that are arranged in the display region in a matrix shape and each of which emits light from a light emitting region. The first electrode layer and the second electrode layer have a mesh shape and are arranged such that a mesh hole and the light emitting region overlap each other.

DETAILED DESCRIPTION OF THE INVENTION

Figure 1:
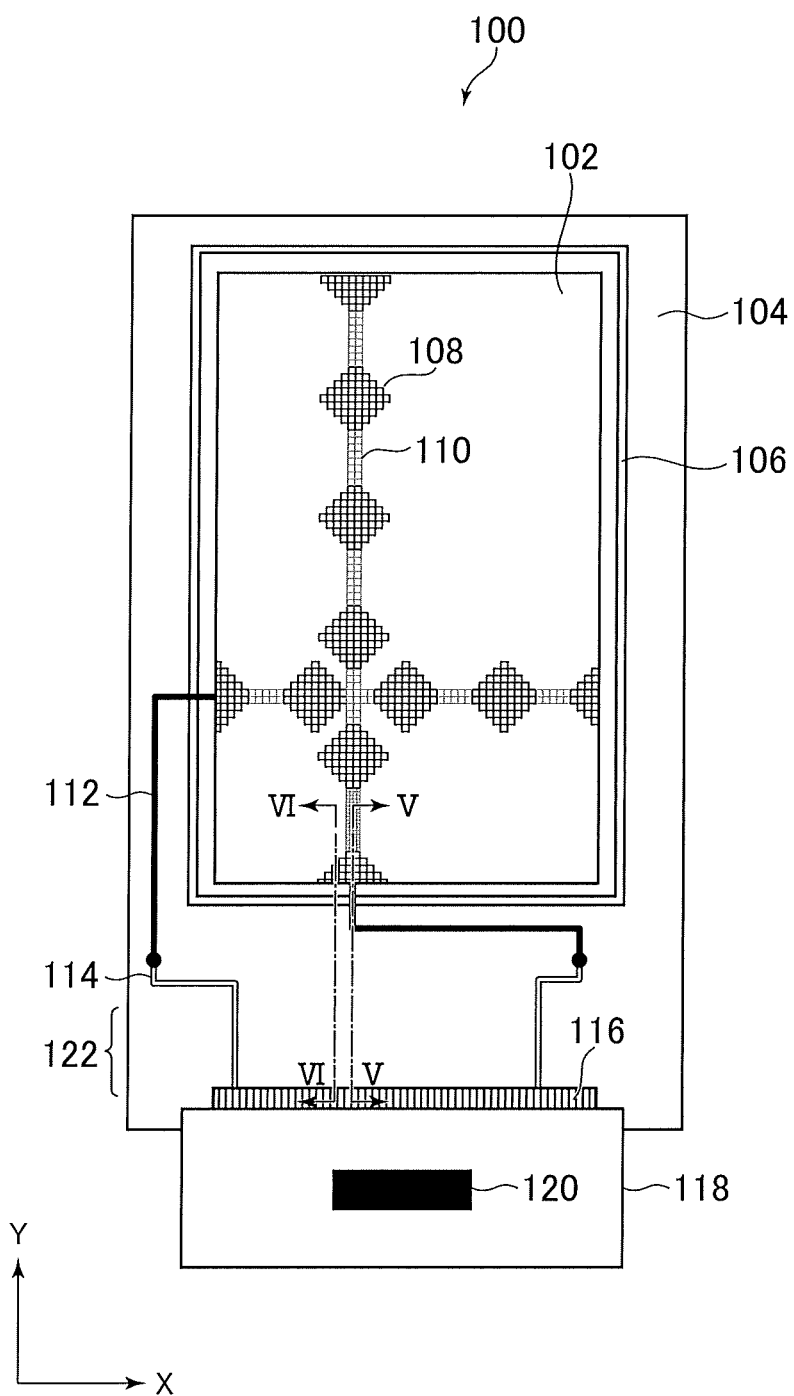
FIG. 1 is a diagram schematically illustrating a display device according to an embodiment of the present invention.

Hereinafter, each of embodiments of the present invention will be described with reference to the drawings. The present disclosure is merely exemplary, and appropriate modifications that can be easily conceived by those skilled in the art within the scope of the present invention are, of course, included in the range of the present invention. In addition, in order to further clarify the description, the width, thickness, shape, and the like of each portion are schematically illustrated in the drawings in some cases as compared to the embodiment. However, the width, thickness, shape, and the like illustrated in the drawings are merely exemplary and are not intended to limit the present invention. In addition, in this specification and in each of the drawings, the same components as those previously described with reference to a previous drawing will be represented by the same reference numerals, and the detailed description thereof will not be repeated appropriately.

Further, in the detailed description of the embodiment of the present invention, when specifying a positional relationship between one structure and another structure, "on" or "below" refers to not only a case where one structure is positioned directly on or directly below another structure but also a case where still another structure is interposed between the components unless specified otherwise.

FIG. 1 is a plan view illustrating an example of a display device 100 according to an embodiment. Examples of the display device 100 include an organic EL display device.

Figure 2A:
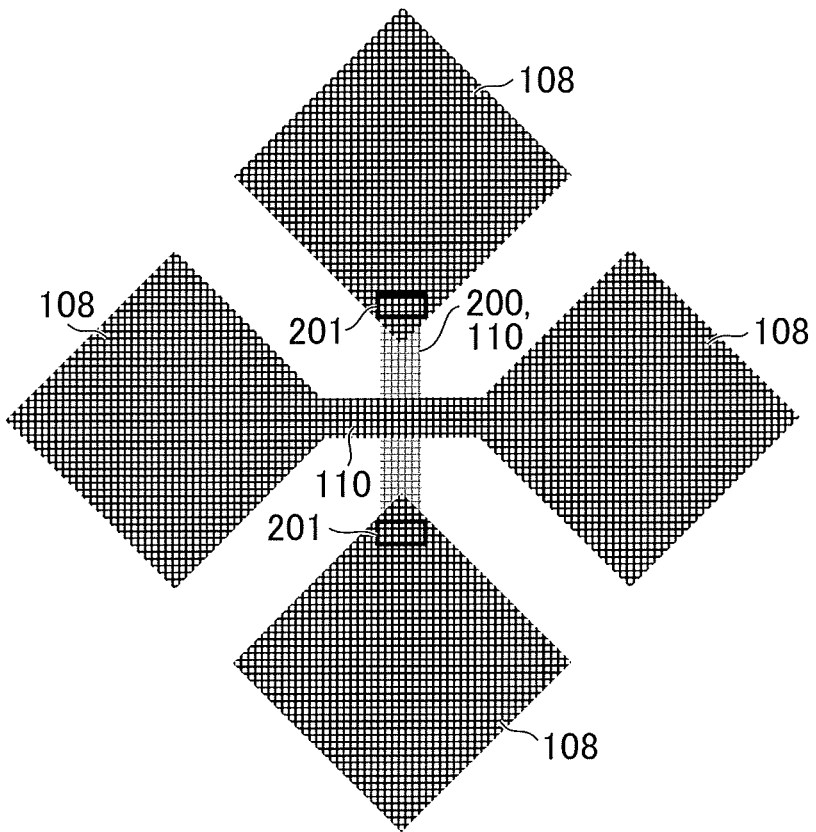
FIG. 2A is a diagram illustrating a first electrode and a second electrode.
Figure 2B:
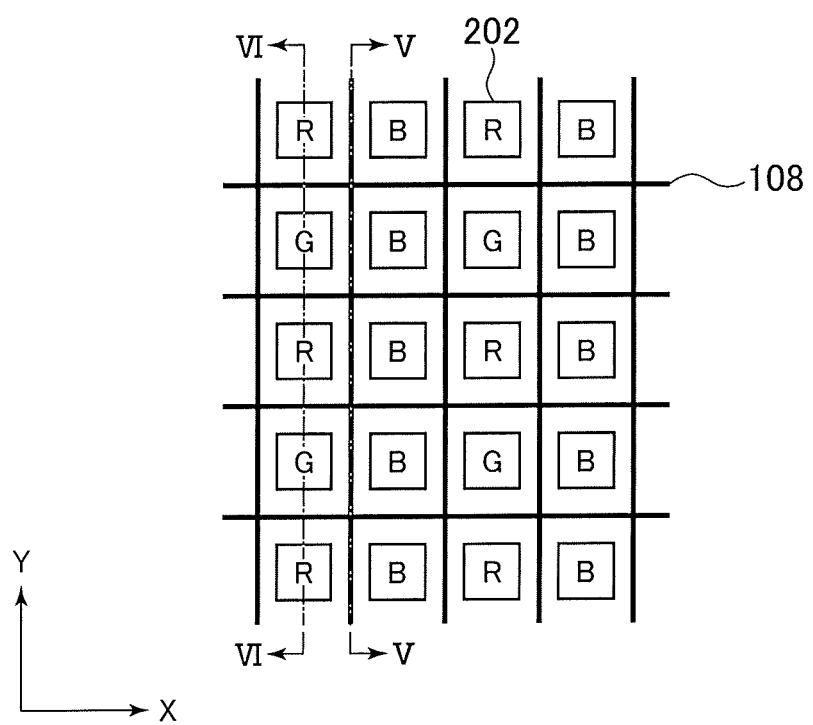
FIG. 2B is a diagram illustrating the first electrode and the second electrode.

The display device 100 includes a display region 102 and a frame region 104. The display device 100 includes a plurality of pixels that are arranged in the display region 102 in a matrix shape and each of which emits light from a light emitting region 202 (refer to FIGS. 2A and 2B). Specifically, in the display region 102, for example, as illustrated in FIG. 2B, pixels each of which is composed of sub-pixels of a plurality of colors including red (R), green (G) and blue (B) are arranged in a matrix shape. A full-color image is displayed by the pixels.

The frame region 104 is arranged outside the display region 102. Specifically, the frame region 104 is disposed in both a X direction and a Y direction of the display region 102. In the frame region 104, a curved region 122 that is curved is provided as described below. In addition, in the frame region 104, a terminal portion 116 that connects the display device 100 and an external device to each other is provided. A third metal 506 described below is exposed through the terminal portion 116. By connecting terminals of a FPC 118 and the third metal 506, power or a signal is supplied from an external device to the display device 100. The X direction is a left-right direction on the drawings, and the Y direction is a up-down direction on the drawings.

In addition, the display device 100 includes a dam portion 106, a touch sensor, the terminal portion 116, the FPC (Flexible Printed Circuit) 118, and a driver IC 120. The dam portion 106 is arranged in the frame region 104. Specifically, the dam portion 106 is arranged in the frame region 104 so as to surround the display region 102.

The touch sensor includes a plurality of electrodes 108 and routing wirings and detects a touched position. Specifically, the electrodes 108 include plural pairs of drive electrodes and detection electrodes. The plural pairs of drive electrodes and detection electrodes are arranged to be separated from each other in the X direction and the Y direction and form main capacitances mutually. For example, the drive electrodes are a plurality of lozenge-shaped electrodes that are arranged along the X direction and the Y direction. In addition, as illustrated in FIGS. 1 and 2A, the drive electrodes that are arranged along the X direction are electrically connected to each other through wirings 110 that connect the respective lozenge-shaped portions to each other. On the other hand, the drive electrodes that are arranged along the Y direction are not electrically connected to each other. FIG. 2A is an enlarged plan view illustrating four electrodes adjacent to each other.

The detection electrodes are a plurality of lozenge-shaped electrodes that are arranged along the X direction and the Y direction. In addition, the detection electrodes that are arranged along the Y direction are electrically connected to each other through the wirings 110 that connect the respective lozenge-shaped portions to each other. On the other hand, the detection electrodes that are arranged along the X direction are not electrically connected to each other. The shapes of the drive electrodes and the detection electrodes may be shapes other than a lozenge shape.

The wirings 110 that connect the drive electrodes arranged along the X direction to each other and the wirings 110 that connect the detection electrodes arranged along the Y direction to each other are formed in different layers. In addition, the wirings 110 that connect the detection electrodes arranged along the Y direction to each other and the electrode 108 are formed in different layers. The wirings 110 that are arranged in the layer different from the electrodes 108 are electrically connected to the detection electrodes through contact holes 201. As a result, the drive electrodes and the detection electrodes are formed not to be electrically connected to each other. In addition, the pairs of drive electrodes and detection electrodes are arranged adjacent to a surface of a display panel such that each of the electrodes functions as an electrode of a capacitor to form a capacitance.

The electrodes 108 are formed in a lozenge shape and a mesh shape. Specifically, as illustrated in FIGS. 1, 2A, and 2B, the drive electrodes and the detection electrodes are formed in a mesh shape. Here, FIG. 2B is a further enlarged plan view illustrating a part of one electrode. In addition, the electrode 108 is arranged such that a mesh hole portions and the light emitting region 202 overlap each other. Specifically, as illustrated in FIG. 2B, the mesh hole portions are arranged at positions overlapping the respective light emitting regions 202 of the sub-pixels of red (R), green (G), and blue (B). As a result, light emitted from each of the sub-pixels is not blocked by the electrodes 108, and the luminance of the display device 100 can be improved. FIG. 2B is an enlarged view illustrating a part of FIG. 2A. In addition, the shape of the electrodes 108 may be a shape other than a lozenge shape.

The routing wirings are electrically connected to the electrodes 108 and are arranged in the frame region 104. Specifically, one routing wiring is arranged for each drive electrode and detection electrode which are electrically connected each other by the wirings 110. Each of the routing wirings electrically connects the terminal portion 116 and the electrodes 108 to each other through the frame region 104 and the curved region 122. As illustrated in FIG. 1, the routing wiring may be formed by a first routing wiring 112 arranged in a first layer and a second routing wiring 114 arranged in a second layer such that the first routing wiring 112 and the second routing wiring 114 are connected to each other through the frame region 104.

The touch sensor detects a touched position based on a voltage of the detection electrode that is changed by a signal input to the drive electrode. Specifically, a drive signal is input to the drive electrode. The voltage of the detection electrode changes depending on the drive signal through a capacitance. The touch sensor detects a touched position based on a voltage change of the detection electrode.

The FPC 118 is connected to the terminal portion 116. The FPC 118 is formed of a resin and has flexibility. In the FPC 118, the driver IC 120 is arranged, and power or a signal is supplied to a circuit formed in the touch sensor or the display region 102.

The driver IC 120 is arranged in the FPC 118, and power or a signal is supplied to a circuit formed in the touch sensor or the display region 102. Specifically, for example, the driver IC 120 applies, for example, a potential for electrical connection between a source and a drain to a scanning signal line of a pixel transistor arranged corresponding to each of the sub-pixels constituting one pixel, and causes a current corresponding to a gradation value of the sub-pixel to flow through each of pixel transistor data signal lines. Using the driver IC 120, the display device 100 displays an image on the display region 102. In addition, the driver IC 120 generates a signal to be input to the drive electrode and detects a touched position based on a voltage of the detection electrode.

Figure 3:
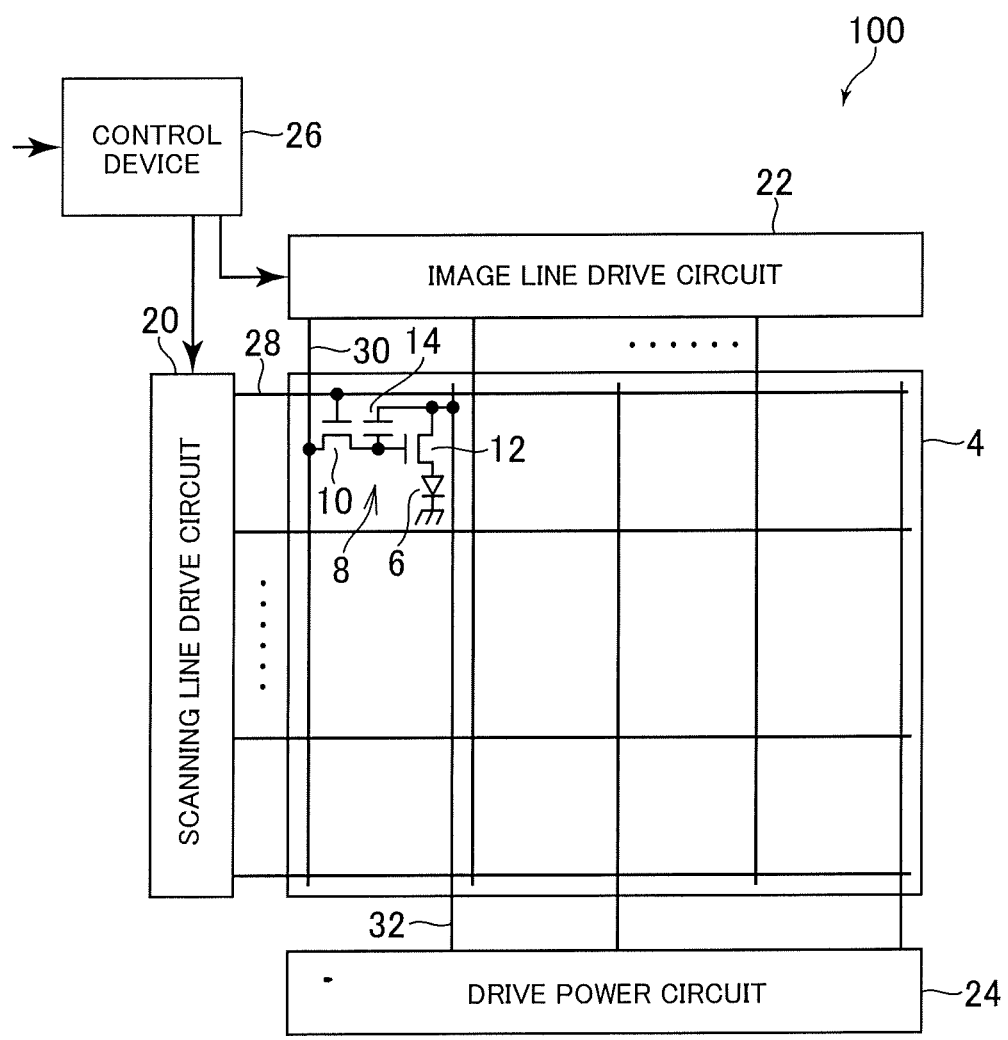
FIG. 3 is a schematic diagram illustrating the summary of a pixel circuit and a peripheral circuit.

FIG. 3 is a schematic diagram illustrating the summary of a pixel circuit and a peripheral circuit included in the display device 100. The display device 100 includes: a pixel array unit 4 that displays an image; and a drive unit that drives the pixel array unit 4.

In the pixel array unit 4, organic light emitting diodes 6 and pixel circuits 8 are arranged in a matrix shape corresponding to pixels. The pixel circuit 8 includes a sampling TFT (thin film transistor) 10, a drive TFT 12, a capacitor 14 and the like.

On the other hand, the drive unit includes a scanning line drive circuit 20, an image line drive circuit 22, a drive power circuit 24, and a control device 26, drives the pixel circuit 8, and controls light emitting of the organic light emitting diodes 6.

The scanning line drive circuit 20 is connected to scanning signal lines 28 provided on horizontal lines (pixel rows) of the pixels. The scanning line drive circuit 20 sequentially selects the scanning signal lines 28 at timing signal input from the control device 26 and applies a voltage to the selected scanning signal line 28 to turn on the sampling TFT 10.

The image line drive circuit 22 is connected to image signal lines 30 provided on vertical lines (pixel columns) of the pixels. When an image signal is input from the control device 26 and the scanning signal line 28 is selected by the scanning line drive circuit 20, the image line drive circuit 22 outputs a voltage corresponding to the image signal of the selected pixel row to each of the image signal lines 30. The voltage is applied into the capacitor 14 on the selected pixel row through the sampling TFT 10. The drive TFT 12 supplies a current corresponding to the applied voltage to the organic light emitting diode 6. As a result, the organic light emitting diode 6 of the pixel corresponding to the selected scanning signal line 28 emits light.

The drive power circuit 24 is connected to a drive power line 32 provided on each of the pixel columns and supplies a current to the organic light emitting diode 6 through the drive power line 32 and the drive TFT 12 on the selected pixel row.

Here, a lower electrode of the organic light emitting diode 6 is connected to the drive TFT 12. On the other hand, an upper electrode 520 (refer to FIG. 5) of each of the organic light emitting diodes 6 is configured with an electrode common to the organic light emitting diodes 6 of all the pixels. When a lower electrode 512 (refer to FIG. 5) is configured as an anode, a high potential is input thereto. In this case, the upper electrode 520 is configured as a cathode, and a low potential is input thereto. When the lower electrode 512 is configured as a cathode, a low potential is input thereto. In this case, the upper electrode 520 is configured as an anode, and a high potential is input thereto.

Figure 4:
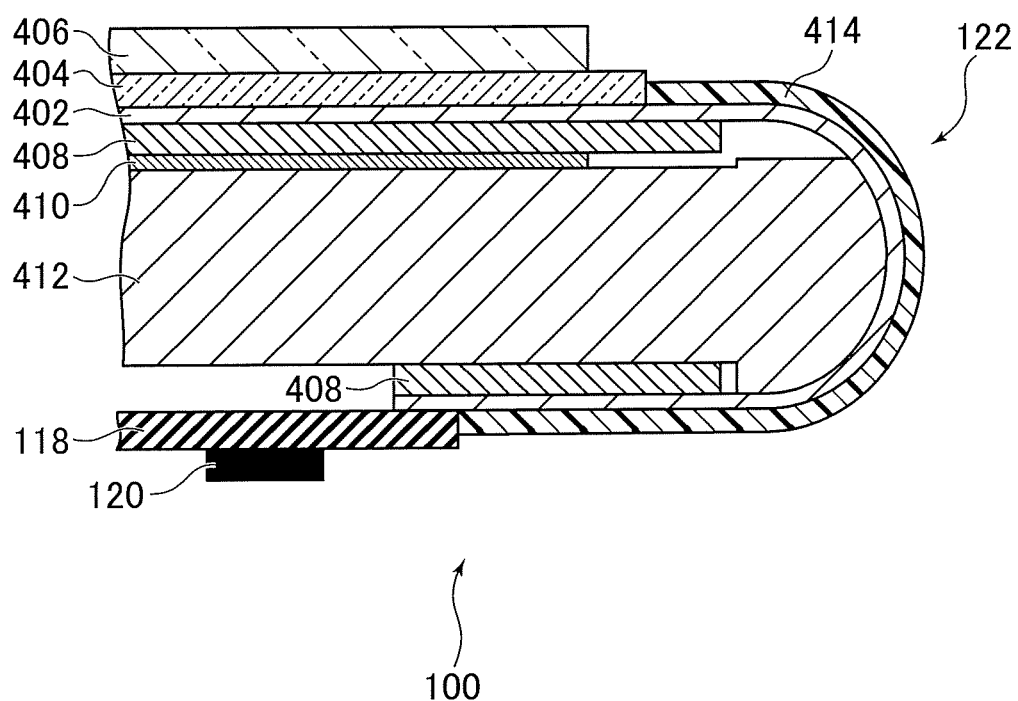
FIG. 4 is a diagram illustrating a curved display device.

Next, the display device 100 in a curved state will be described. FIG. 4 is a diagram illustrating a schematic cross-section of the display device 100 near the curved region 122. As illustrated in FIG. 4, the display device 100 includes a substrate 402, a protective film 404, a polarizing plate 406, a reinforcing film 408, a thermal diffusion sheet 410, a spacer 412, the FPC 118, the driver IC 120, and a reinforcing resin 414.

The substrate 402 is curved in the curved region 122. Each of layers such as a circuit layer 502 or a sealing film 522 is arranged on the substrate 402 but is not illustrated in FIG. 4.

The protective film 404 is arranged on the substrate 402. The protective film 404 is a film that protects each of the layers arranged on the substrate 402.

The polarizing plate 406 reduces reflection of external light incident into the display device 100. As a result, the visibility of the display device 100 is improved.

The reinforcing film 408 is a film that reinforces the display device 100. The reinforcing film 408 is arranged in flat regions of a front surface and a back surface of the display device 100 in a curved state.

The thermal diffusion sheet 410 is a sheet that diffuses heat of the display device 100. Specifically, the thermal diffusion sheet 410 diffuses heat generated from a drive circuit to the entire region of the display device 100, the drive circuit being arranged around the display device 100. As a result, a state where only a part of the display device 100 is heated to a high temperature is prevented.

The spacer 412 is arranged between a portion of the front surface side and a portion of the back surface side in the folded display device 100. The spacer 412 maintains more constantly a gap between the portion of the front surface side and the portion of the back surface side. As a result, even when a pressure is applied to the display device 100 in a thickness direction, the curvature of the curved region 122 is maintained in an allowable range.

In addition, an end portion of the spacer 412 is formed to have a curved surface at a curvature corresponding to a rear surface of the curved region 122. By bringing the end portion of the spacer 412 into contact with the rear surface of the curved region 122, the shape of the curved region 122 can be constantly maintained even when a pressure is applied to the surface of the curved region 122. Due to the spacer 412, stress applied to a wiring arranged in the curved region 122 can be reduced, and the breakage of the wiring can be suppressed.

The FPC 118 is connected to the terminal portion 116 of the substrate 402. In the FPC 118, the driver IC 120 that controls lighting of the pixels is arranged.

The reinforcing resin 414 is a rein that reinforces the display device 100. The reinforcing resin 414 is arranged in the curved region 122 of the display device 100 in a curved state.

A configuration in which the reinforcing resin 414 is not bonded to the curved region 122 may be adopted. In this configuration, the flexibility of the curved region 122 increases, and the display device 100 can be curved with a smaller radius of curvature. As the radius of curvature of the curved region 122 decreases, the size of the folded display device 100 in a plan view also decreases, and the thickness of the folded display device 100 also decreases.

Figure 5:
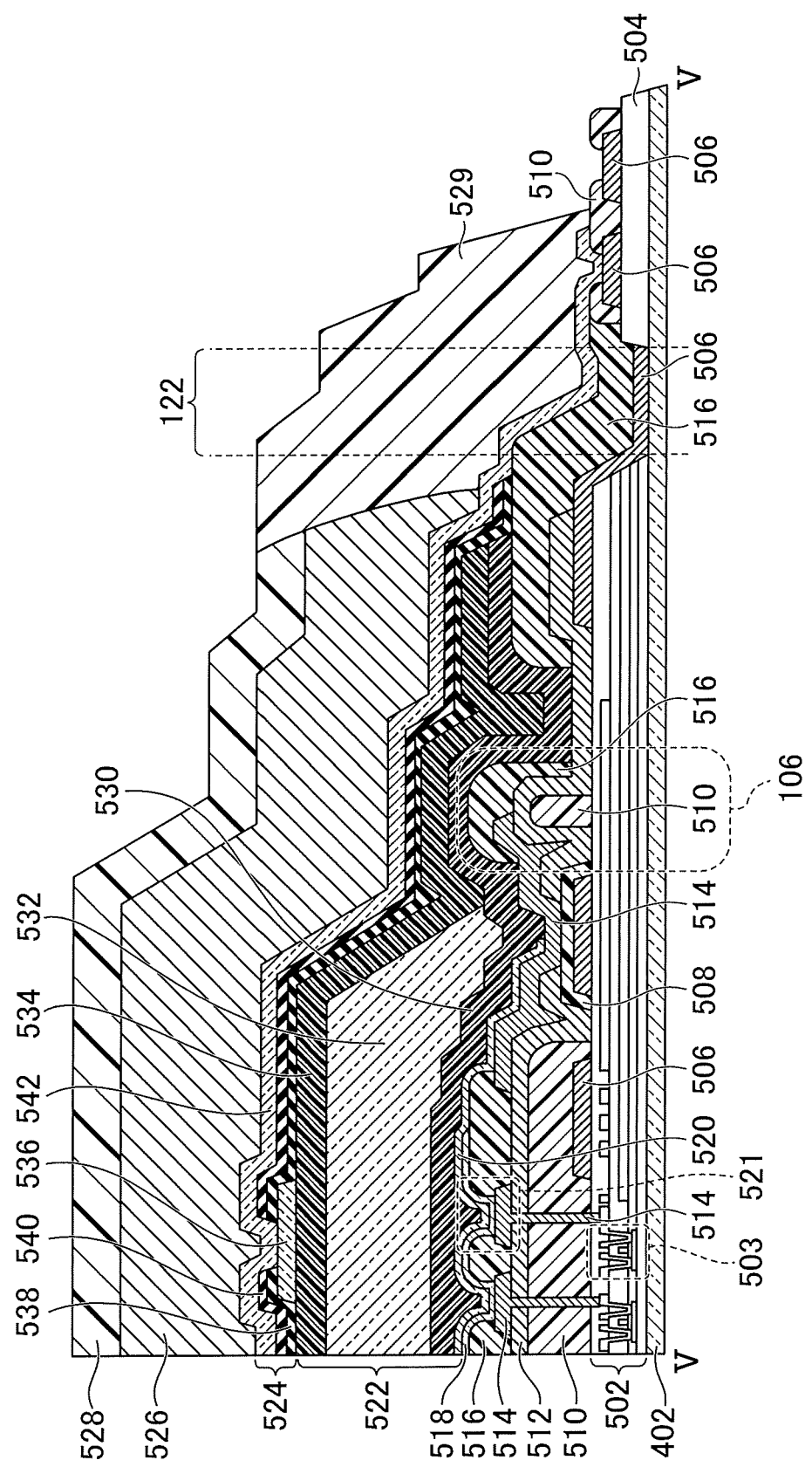
FIG. 5 is a diagram illustrating a V-V cross-section of the display device.
Figure 6:
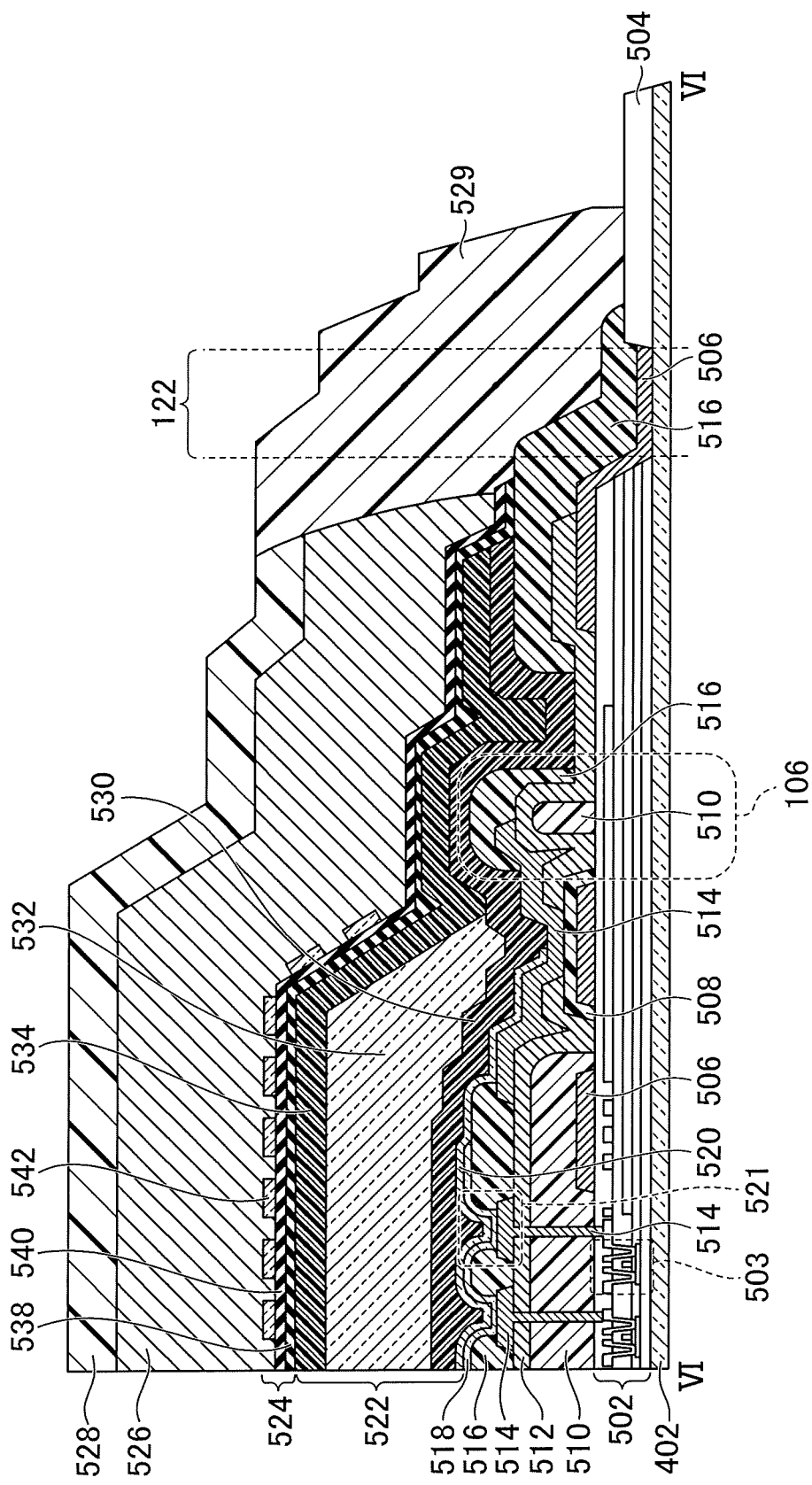
FIG. 6 is a diagram illustrating a VI-VI cross-section of the display device.

Next, a cross-section of the display device 100 will be described. FIG. 5 is a diagram illustrating a V-V cross-section of FIGS. 1 and 2B. FIG. 6 is a diagram illustrating a VI-VI cross-section of FIGS. 1 and 2B.

As illustrated in FIGS. 5 and 6, the display device 100 includes the substrate 402, the circuit layer 502, the third metal 506, a transparent electrode 508, a planarizing film 510, an interlayer film 512, a lower electrode 514, a rib 516, an EL layer 518, the upper electrode 520, the sealing film 522, a touch sensor layer 524, an overcoat 526, a polarizing plate 528, and a neutral plane maintaining organic film 529.

The substrate 402 is formed of glass or a flexible material such as polyimide. By using the flexible material, the display device 100 can be bent.

The circuit layer 502 includes an insulating layer, a source electrode, a drain electrode, a gate electrode, a semiconductor layer, a passivation layer 504 and the like that are provided on the substrate 402. A transistor 503 is configured with the source electrode, the drain electrode, the gate electrode, and the semiconductor layer. The transistor 503 controls, for example, a current flowing through the EL layer 518 formed on the pixel. In addition, the transistor 503 corresponds to the drive TFT 12 in FIG. 3.

The third metal 506 is arranged on the passivation layer 504. Specifically, the third metal 506 is arranged on the passivation layer 504 in the display region 102 and the frame region 104. The third metal 506 arranged in the display region 102 configures a part of the pixel circuit. The third metal 506 arranged in the frame region 104 is a wiring provided in the terminal portion 116.

The transparent electrode 508 is arranged on the third metal 506 arranged in the frame region 104. The transparent electrode 508 is electrically connected to the lower electrode 514 and the third metal 506.

The planarizing film 510 is arranged in the display region 102 and the frame region 104. Specifically, the planarizing film 510 is arranged on each of the circuit layer 502 and the third metal 506 in the display region 102. The planarizing film 510 arranged in the display region 102 prevents short-circuiting between the lower electrode 514 and an electrode included in the circuit layer 502 and planarizes steps generated by the wiring or the transistor 503 arranged in the circuit layer 502. The planarizing film 510 arranged in the frame region 104 configures the dam portion 106. In addition, the planarizing film 510 arranged in the terminal portion 116 separates a plurality of terminals formed in the third metal 506 from each other to prevent the terminals from being electrically connected to each other.

The interlayer film 512 is arranged on the planarizing film 510. A material of the interlayer film 512 is an inorganic insulating film such as silicon nitride. In the interlayer film 512, a contact hole is provided in the frame region 104, and the third metal 506 and the lower electrode 514 are electrically connected to each other through the contact hole.

The lower electrode 514 is arranged on the interlayer film 512. Specifically, the lower electrode 514 is formed in the display region 102 to be electrically connected to the source or drain electrode of the transistor 503 formed in the circuit layer 502 through a contact hole formed in the interlayer film 512 and the planarizing film 510.

The rib 516 is arranged on the planarizing film 510. Specifically, in the display region 102, the rib 516 is formed so as to surround a light emitting region of the EL layer 518.

The EL layer 518 is formed on the lower electrode 514. Specifically, the EL layer 518 is formed on the lower electrode 514 and an end portion of the rib 516 in the display region 102. In addition, the EL layer 518 is formed by laminating a hole injection layer, a hole transport layer, a light emitting layer, an electron transport layer, and an electron injection layer. The light emitting layer emits light, for example, by recombination of holes injected from the lower electrode 514 and electrons injected from the upper electrode 520. Since the hole injection layer, the hole transport layer, the electron transport layer, and the electron injection layer are the same as those of the related art, the description thereof will not be repeated. In the embodiment, the light emitting layer is formed using a material that emits light of red, green and blue.

The upper electrode 520 is formed on the EL layer 518. By causing a current to flow between the upper electrode 520 and the lower electrode 514, the light emitting layer included in the EL layer 518 emits light. The upper electrode 520 is formed of a transparent conductive film including metal such as ITO or IZO or a metal thin film having optical transparency formed of AgMg. A contact portion between the lower electrode 514, the EL layer 518, and the upper electrode 520 configures an organic light emitting element 521. The organic light emitting element 521 corresponds to the organic light emitting diode 6 in FIG. 3.

The sealing film 522 is arranged so as to cover the display region 102 where an image is displayed. Specifically, the sealing film 522 is arranged so as to cover the entire region of the display region 102 and a part of the frame region 104.

In addition, the sealing film 522 includes a lower barrier film 530, a sealing planarizing film 532, and an upper barrier film 534. Specifically, the lower barrier film 530 is formed so as to cover the upper electrode 520 in the display region 102. The sealing planarizing film 532 is arranged so as to cover the lower barrier film 530 inside the dam portion 106. The sealing planarizing film 532 planarizes unevenness of the lower barrier film 530. The upper barrier film 534 is formed so as to cover the lower barrier film 530 and the sealing planarizing film 532. The lower barrier film 530 and the upper barrier film 534 are formed of an inorganic material such as SiN that prevents permeation of water. The sealing planarizing film 532 is formed of, for example, acryl or epoxy. The sealing film 522 prevents permeation of water into the EL layer 518 such that deterioration of the EL layer 518 can be prevented.

The touch sensor layer 524 includes a first electrode layer 536, a first insulating layer 538, a second insulating layer 540, and a second electrode layer 542. The first electrode layer 536 is arranged on the sealing film 522. Specifically, as illustrated in FIG. 5, the first electrode layer 536 is arranged on the upper barrier film 534 included in the sealing film 522. The first electrode layer 536 is the wirings 110 that electrically connect the electrodes 108 arranged along either the X direction or the Y direction. The first electrode layer 536 performs an input of a drive signal or an output of a detection signal through the second electrode layer 542. The first electrode layer 536 is electrically connected to the second electrode layer 542 through a contact hole provided in the first insulating layer 538 and the second insulating layer 540. The second electrode layer 542 connected to the first electrode layer 536 is a part of the routing wiring. In a region illustrated in FIG. 6, the first electrode layer 536 is not arranged.

The first insulating layer 538 is formed on the first electrode layer 536 using a material including nitrogen. Specifically, a parasitic capacitor is formed in a region where the first electrode layer 536, the first insulating layer 538, and the second electrode layer 542 overlap each other in a plan view. The parasitic capacitor deteriorates the detection accuracy of the touch sensor. Therefore, the first insulating layer 538 is formed of silicon nitride as a material that reduces the capacity of the parasitic capacitor.

In addition, as illustrated in FIG. 5, in the first insulating layer 538, a contact hole for electrical connection between the first electrode layer 536 and the second electrode layer 542 is provided. The contact hole electrically connects the electrode 108 that is formed as the drive electrode or the detection electrode and the terminal portion 116 to each other. In a region other than the region where the contact hole is provided, the first insulating layer 538 is formed so as to cover the first electrode layer 536. As a result, short-circuiting between the drive electrode and the detection electrode can be prevented.

The second insulating layer 540 is formed between the first insulating layer 538 and the overcoat 526 using a material not including nitrogen. Specifically, the second insulating layer 540 is arranged between the first insulating layer 538 and the second electrode layer 542 so as to cover the first insulating layer 538. The second insulating layer 540 is formed of silicon oxide. In addition, the second insulating layer 540 may be formed of alumina.

The second insulating layer 540 inhibits a reaction between nitrogen included in the first insulating layer 538 and water included in the overcoat 526. Specifically, the second electrode layer 542 is formed in a mesh shape. When the second electrode layer 542 is not provided, the overcoat 526 and the first insulating layer 538 are arranged in contact with each other in a mesh hole portion of the second electrode layer 542. Since the overcoat 526 is formed of an organic material, water may penetrate into the overcoat 526 in the process of manufacturing the display device 100. In this case, water inside the overcoat 526 reacts with nitrogen included in the first insulating layer 538 to form $NH_3^+$ ions. The second insulating layer 540 is arranged between the first insulating layer 538 and the overcoat 526 so as to inhibit a reaction between nitrogen included in the first insulating layer 538 and water included in the overcoat 526. As a result, deterioration of the polarizing plate 528 arranged on the overcoat 526 can be prevented.

The first electrode layer 536 and the second electrode layer 542 formed as the drive electrode or the detection electrode are insulated from each other by the first insulating layer 538 and the second insulating layer 540.

The second electrode layer 542 is arranged over the first insulating layer 538. Specifically, the second electrode is arranged on the second insulating layer 540 arranged on the first insulating layer 538. The second electrode layers 542 are formed as the drive electrode and the detection electrode and are arranged in a lozenge shape in a plan view and a mesh shape. A gap where the second electrode layer 542 is not provided corresponds to a mesh hole portion. That is, as illustrated in FIG. 6, the second electrode layers 542 are arranged on the second insulating layer 540 at regular intervals. In addition, in the region illustrated in FIG. 5, the second electrode layers 542 are continuously formed.

The overcoat 526 is formed so as to cover the touch sensor layer 524. Specifically, the overcoat 526 is arranged so as to cover the second insulating layer 540 and the second electrode layer 542 included in the touch sensor layer 524. As described above, the overcoat 526 is arranged so as not to be in direct contact with the first insulating layer 538. In addition, the overcoat 526 is formed of a resin material.

The polarizing plate 528 is arranged on the overcoat 526. Specifically, the polarizing plate 528 is formed of a material including a polarizing element that is formed of an iodine complex or the like. The polarizing plate 528 prevents the visibility of the display device 100 from deteriorating due to external light.

The neutral plane maintaining organic film 529 is arranged on the touch sensor layer 524 and the planarizing film 510 in the vicinity of the curved region 122. Specifically, the neutral plane maintaining organic film 529 is an organic film that fixes the shape of the display device 100 in a state where the curved region 122 is curved. A neutral plane formed by curving is maintained by the neutral plane maintaining organic film 529. The neutral plane maintaining organic film 529 may be integrated with the reinforcing resin or may be arranged below the reinforcing resin separately from the reinforcing resin. The neutral plane maintaining organic film 529 corresponds to the reinforcing resin 414 in FIG. 4.

As described above, according to the present invention, the first insulating layer 538 including nitrogen and the overcoat 526 including water are arranged so as not to be in direct contact with each other by the second insulating layer 540. As a result, the formation of $NH_3^+$ ions caused by a reaction between the nitrogen included in the first insulating layer 538 and water included in the overcoat 526 can be prevented, and deterioration of the polarizing plate 528 can be prevented.

Figure 7:
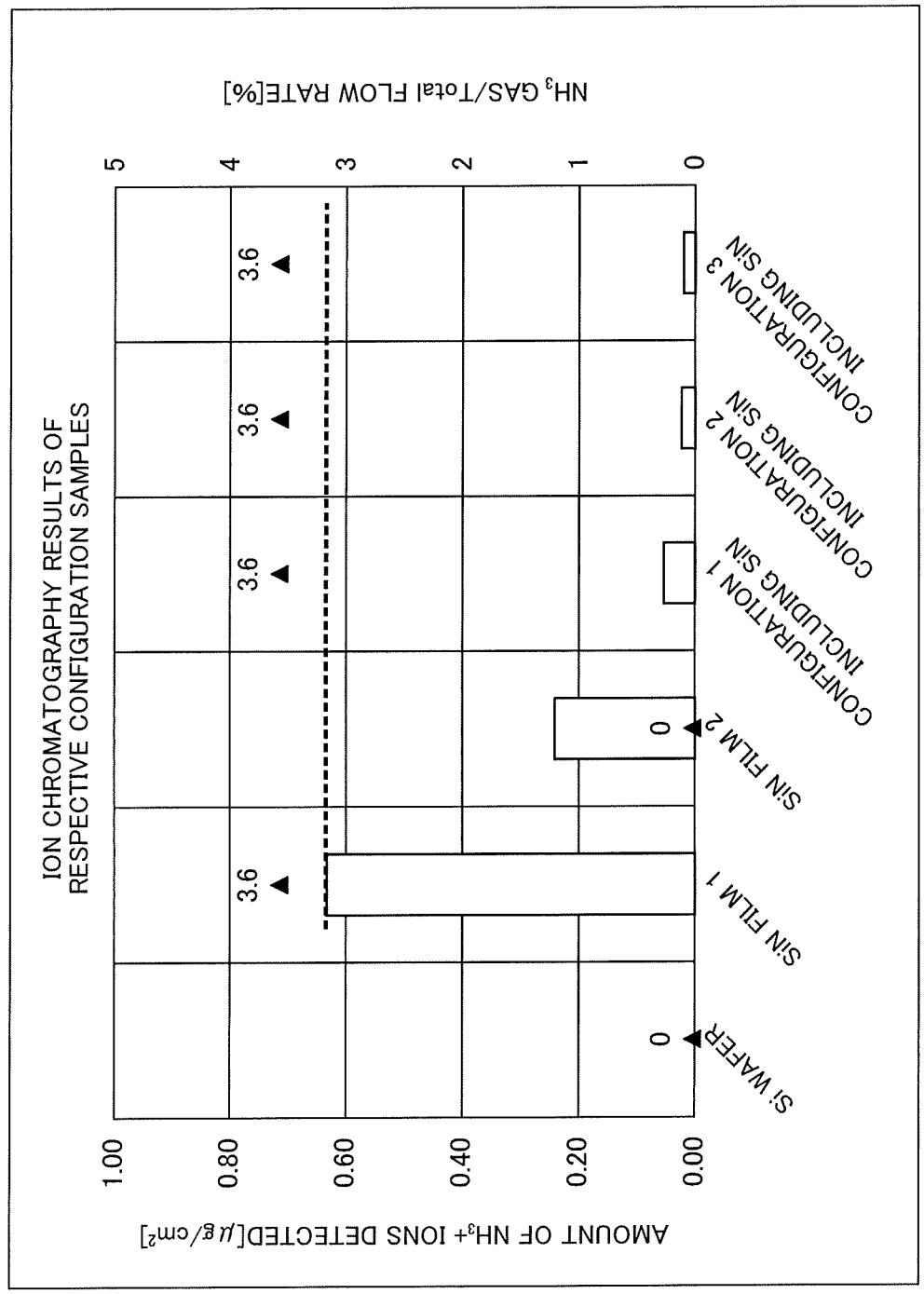
FIG. 7 is a diagram illustrating the amount of $NH_3^+$ ions detected.

Specifically, the effects of the present invention will be described using FIG. 7. FIG. 7 is a diagram illustrating the amount of $NH_3^+$ ions detected, in which the experiment results of the amounts of $NH_3^+$ ions detected from respective samples by ion chromatography are illustrated. In FIG. 7, a triangle symbol represents the flow rate (the right vertical axis of the graph) of $NH_3$ gas introduced into a manufacturing device when silicon nitride is formed using a CVD method. In addition, the height of a bar graph represents the amount (the left vertical axis of the graph) of $NH_3^+$ ions detected.

The measurement samples include a comparative sample not including nitrogen ("Si Wafer" in the drawing), samples of the related art ("SiN Film 1" and "SiN Film 2" in the drawing), and samples of the present invention ("Configuration 1 including SiN", "Configuration 2 including SiN", and "Configuration 3 including SiN" in the drawing).

"SiN Film 1" is a sample that is formed using $NH_3$ gas when silicon nitride as the first insulating layer 538 is formed using a CVD method. "SiN Film 2" is a sample that is formed without using $NH_3$ gas when silicon nitride as the first insulating layer 538 is formed using a CVD method.

In addition, "Configuration 1 including SiN" is a sample prepared by forming silicon nitride as the first insulating layer 538 using $NH_3$ gas and forming silicon oxide as the second insulating layer 540 at a thickness of 30 nm. In addition, "Configuration 2 including SiN" is a sample prepared by forming silicon nitride as the first insulating layer 538 using $NH_3$ gas and forming silicon oxide as the second insulating layer 540 at a thickness of 60 nm.

"Configuration 3 including SiN" is a sample prepared by forming silicon nitride as the first insulating layer 538 using $NH_3$ gas and forming alumina as the second insulating layer 540 at a thickness of 30 nm.

As illustrated in FIG. 7, in "SiN Film 1" as the comparative sample, the amount of $NH_3^+$ ions detected is 0.00 $\mu g/cm^2$. This value is lower than or equal to the lower detection limit of a detection device. Accordingly, it can be verified that the experiment using ion chromatography is performed with high accuracy.

In "Sin Film 1" and "SiN Film 2", the amounts of $NH_3^+$ ions detected are 0.64 $\mu g/cm^2$ and 0.24 $\mu g/cm^2$, respectively. Accordingly, when silicon nitride is formed, the amount of $NH_3^+$ ions formed can be reduced by preventing $NH_3$ gas from being introduced into the manufacturing device. However, in a touch sensor prepared using this method, the transmittance of the first insulating layer 538 decreases. Therefore, the luminance of the display device 100 decreases.

On the other hand, in "Configuration 1 including SiN", "Configuration 2 including SiN", and "Configuration 3 including SiN", the amounts of $NH_3$ ions detected are 0.05 $\mu g/cm^2$, 0.03 $\mu g/cm^2$, and 0.03 $\mu g/cm^2$, respectively. The amounts of NH₃ ions detected in the samples of the present invention are less than those in the samples of the related art.

As described above, it can be seen that, according to the present invention, the amount of $NH_3^+$ ions formed can be reduced as compared to the related art. In addition, since silicon nitride as the first insulating layer 538 is formed using NH₃ gas, a decrease in the luminance of the display device 100 can be prevented.

Figure 8:
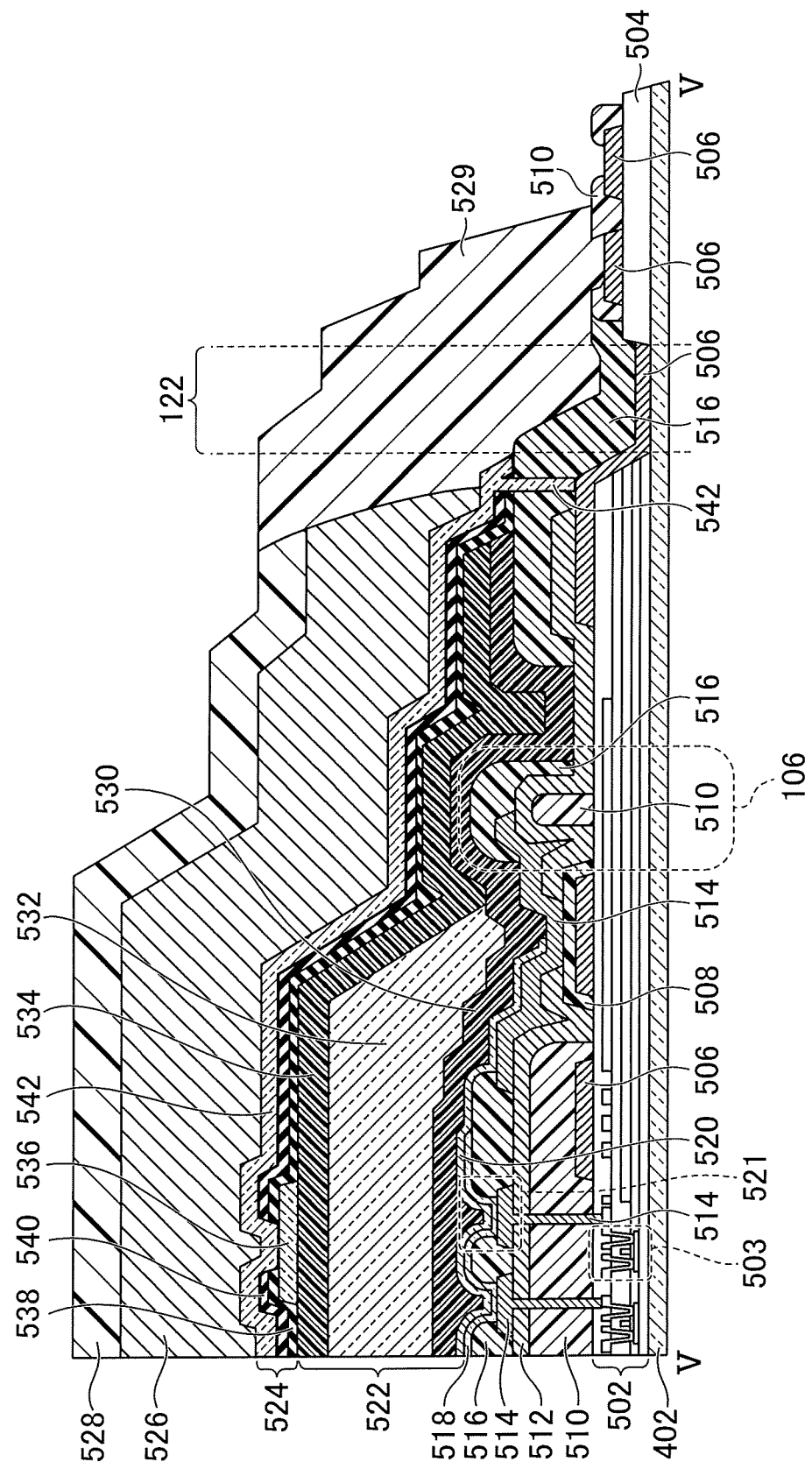
FIG. 8 is a diagram illustrating a modification example.

In a modification example of the embodiment, as illustrated in FIG. 8, the second electrode layer 542 and the third metal 506 may be connected to each other through a contact hole provided in the rib 516 inside the curved region 122. Specifically, the contact hole is formed in the rib 516 inside the curved region 122 and outside the first insulating layer 538 and the second insulating layer 540. The second electrode layer 542 and the third metal 506 are electrically connected to each other through the contact hole. In addition, in the curved region 122, the second electrode layer 542 is not arranged on the rib 516. With this configuration, an inorganic film arranged in the curved region 122 can be removed. As a result, the neutral plane can be easily controlled, and thus the degree of freedom for design relating to the material selection or thickness of each of the layers arranged in the curved region 122 can be increased.

Figure 9:
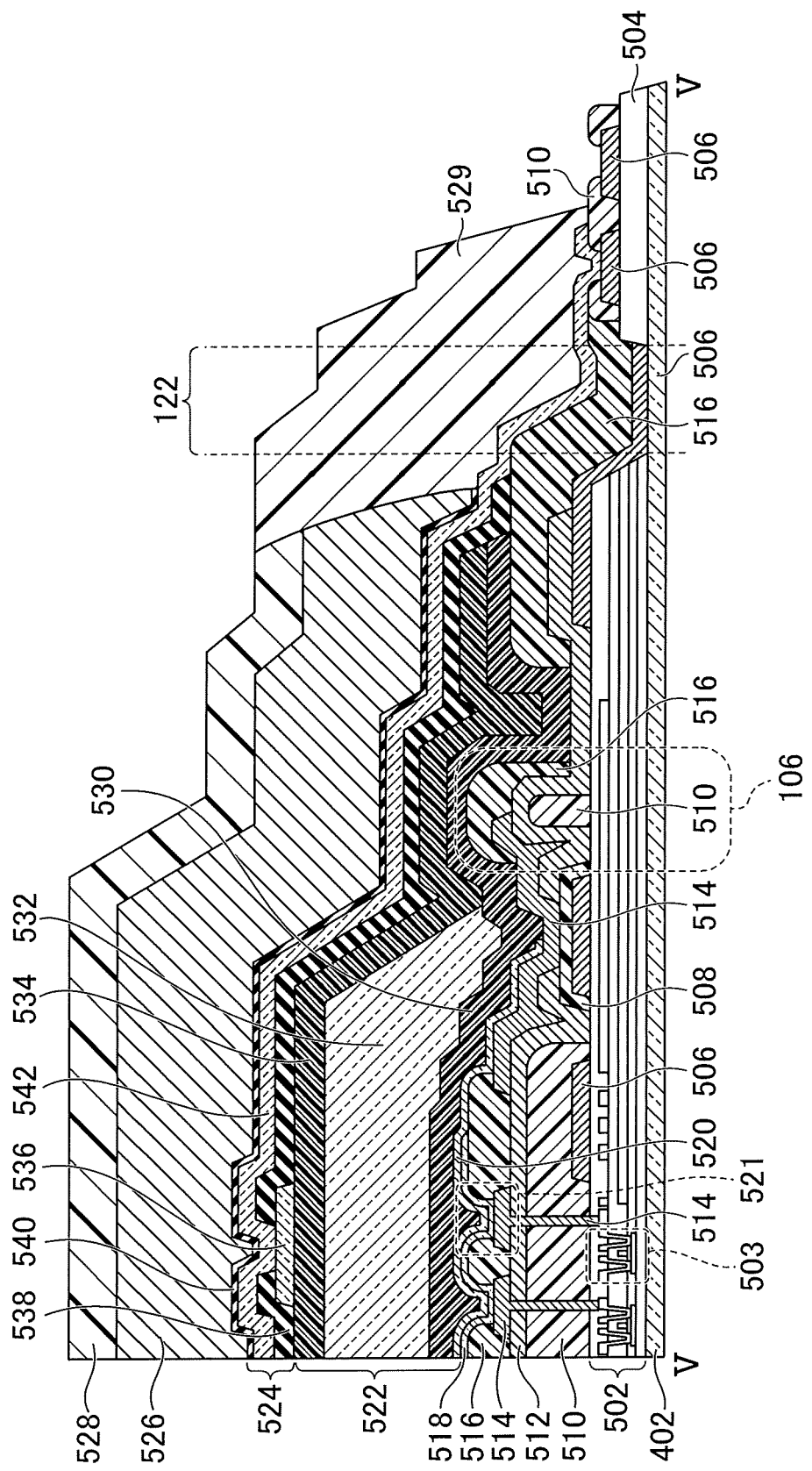
FIG. 9 is a diagram illustrating another modification example.

In addition, in another modification example of the embodiment, the second insulating layer 540 may be arranged on the second electrode layer 542 so as to cover the display region 102. Specifically, as illustrated in FIG. 9, the second insulating layer 540 may be arranged between the second electrode layer 542 and the overcoat 526. In addition, by arranging the second insulating layer 540 so as to cover the display region 102, the first insulating layer 538 exposed from the mesh hole portion of the second electrode layer 542 is covered by the second insulating layer 540. With this configuration, the first insulating layer 538 and the overcoat 526 are arranged so as not to be in direct contact with each other. Accordingly, even in this configuration, the amount of $NH_3^+$ ions formed can be reduced as compared to the related art.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a sealing film covering a display region where an image is configured to be displayed;
   a touch sensor layer configured to detect a touched position of the display region, the touch sensor layer including a first electrode layer that is arranged on the sealing film, a first insulating layer that is formed on the first electrode layer using a material including nitrogen, and a second electrode layer that is arranged over the first insulating layer;
   an overcoat covering the touch sensor layer; and
   a polarizing plate being arranged on the overcoat, wherein
   the touch sensor layer further includes a second insulating layer configured to inhibit a reaction between nitrogen included in the first insulating layer and water included in the overcoat, the second insulating layer being formed between the first insulating layer and the overcoat using a material not including nitrogen.

2. The display device according to claim 1, wherein the second insulating layer is arranged between the first insulating layer and the second electrode layer and covers the first insulating layer.

3. The display device according to claim 1, wherein the second insulating layer is arranged between the second electrode layer and the overcoat and covers the display region.

4. The display device according to claim 1, wherein the first insulating layer is formed of silicon nitride, and the second insulating layer is formed of silicon oxide or alumina.

5. The display device according to claim 1, further comprising:
   a plurality of pixels that are arranged in the display region in a matrix shape and each of which emits light from a light emitting region, wherein
   the first electrode layer and the second electrode layer have a mesh shape and are arranged such that a mesh hole and the light emitting region overlap each other.

* * * * *